(12) United States Patent
Huang et al.

(10) Patent No.: US 7,998,884 B2
(45) Date of Patent: Aug. 16, 2011

(54) METHOD OF FORMING A LIGHT EMITTING DEVICE WITH A NANOCRYSTALLINE SILICON EMBEDDED INSULATOR FILM

(75) Inventors: Jiandong Huang, Vancouver, WA (US); Pooran Chandra Joshi, Vancouver, WA (US); Apostolos T. Voutsas, Portland, OR (US); Hao Zhang, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 474 days.

(21) Appl. No.: 12/126,430

(22) Filed: May 23, 2008

(65) Prior Publication Data

US 2008/0224164 A1    Sep. 18, 2008

Related U.S. Application Data

(63) Continuation-in-part of application No. 11/418,273, filed on May 4, 2006, now Pat. No. 7,544,625, which is a continuation-in-part of application No. 11/327,612, filed on Jan. 6, 2006, now Pat. No. 7,723,242, and a continuation-in-part of application No. 11/139,726, filed on May 26, 2005, now Pat. No. 7,381,595, and a continuation-in-part of application No. 11/013,605, filed on Dec. 15, 2004, now Pat. No. 7,446,023, and a continuation-in-part of application No. 10/871,939, filed on Jun. 17, 2004, now Pat. No. 7,186,663, and a continuation-in-part of application No. 10/801,377, filed on Mar. 15, 2004, now Pat. No. 7,122,487, and a continuation-in-part of application No. 10/801,374, filed on Mar. 15, 2004, now Pat. No. 7,087,537.

(51) Int. Cl.
  *H01L 21/469* (2006.01)

(52) U.S. Cl. ............ 438/788; 438/29; 438/485; 257/87; 257/E21.09

(58) Field of Classification Search .................. 438/788
See application file for complete search history.

(56) References Cited

U.S. PATENT DOCUMENTS

| | | | |
|---|---|---|---|
| 5,216,303 A | 6/1993 | Lu | |
| 6,157,047 A * | 12/2000 | Fujita et al. | 257/51 |
| 6,184,158 B1 * | 2/2001 | Shufflebotham et al. | 438/788 |
| 7,141,936 B2 | 11/2006 | McIntyre | |
| 2002/0043943 A1 | 4/2002 | Menzer et al. | |
| 2004/0106285 A1 * | 6/2004 | Zacharias | 438/689 |
| 2006/0097654 A1 | 5/2006 | McIntyre | |
| 2006/0180817 A1 * | 8/2006 | Hsu et al. | 257/79 |
| 2006/0211267 A1 | 9/2006 | Joshi et al. | |

* cited by examiner

*Primary Examiner* — Wael M Fahmy
*Assistant Examiner* — Abul Kalam
(74) *Attorney, Agent, or Firm* — Law Office of Gerald Maliszewski; Gerald Maliszewski

(57) ABSTRACT

A light emitting device using a silicon (Si) nanocrystalline Si insulating film is presented with an associated fabrication method. The method provides a doped semiconductor or metal bottom electrode. Using a high density plasma-enhanced chemical vapor deposition (HDPECVD) process, a Si insulator film is deposited overlying the semiconductor electrode, having a thickness in a range of 30 to 200 nanometers (nm). For example, the film may be SiOx, where X is less than 2, Si₃Nx, where X is less than 4, or SiCx, where X is less than 1. The Si insulating film is annealed, and as a result, Si nanocrystals are formed in the film. Then, a transparent metal electrode is formed overlying the Si insulator film. An annealed Si nanocrystalline SiOx film has a turn-on voltage of less than 20 volts, as defined with respect to a surface emission power of greater than 0.03 watt per square meter.

11 Claims, 6 Drawing Sheets

METHOD OF FORMING A LIGHT EMITTING DEVICE WITH A NANOCRYSTALLINE SILICON EMBEDDED INSULATOR FILM

RELATED APPLICATIONS

This application is a continuation-in-part of a patent application entitled, SILICON OXIDE THIN-FILMS WITH EMBEDDED NANOCRYSTALLINE SILICON, invented by Pooran Joshi et al., Ser. No. 11/418,273, filed May 4, 2006 now U.S. Pat. No. 7,544,625, which is a Continuation-in-Part of the following applications:

ENHANCED THIN-FILM OXIDATION PROCESS, invented by Pooran Joshi et al., Ser. No. 11/327,612, filed Jan. 6, 2006 now U.S. Pat. No. 7,723,242;

HIGH-DENSITY PLASMA HYDROGENATION, invented by Pooran Joshi et al., Ser. No. 11/013,605, filed Dec. 15, 2004 now U.S. Pat. No. 7,556,023;

DEPOSITION OXIDE WITH IMPROVED OXYGEN BONDING, invented by Pooran Joshi, Ser. No. 10/801,377, filed Mar. 15, 2004 now U.S. Pat. No. 7,122,487;

HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595;

HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663;

METHOD FOR FABRICATING OXIDE THIN-FILMS, invented by Joshi et al., Ser. No. 10/801,374, filed Mar. 15, 2004 now U.S. Pat. No. 7,087,537.

All the above-referenced applications are incorporated herein by reference.

BACKGROUND OF THE INVENTION

1. Field of the Invention

This invention generally relates to integrated circuit (IC) fabrication and, more particularly, to a light emitting device made from a silicon (Si) microcrystalline silicon oxide film.

2. Description of the Related Art

The unique structural, electrical, and optical properties of nanocrystalline silicon have attracted interest for their use in optoelectronic and integrated memory devices. Silicon is the material of choice for the fabrication of optoelectronic devices because of well-developed processing technology. However, the indirect band-gap makes it an inefficient material for light emitting optoelectronic devices. Over the years, various R&D efforts have focused on tailoring the optical function of Si to realize Si-based light emitting optoelectronics. The achievement of efficient room temperature light emission from the crystalline silicon is a major step towards the achievement of fully Si-based optoelectronics.

The fabrication of stable and reliable optoelectronic devices requires Si nanocrystals with high photoluminescence (PL) and electroluminescence (EL) quantum efficiency. One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded $SiO_x$ thin films depend on the size, concentration, and size distribution of the Si nanocrystals. Various thin-film deposition techniques such as sputtering and plasma-enhanced chemical vapor deposition (PECVD), employing capacitively-coupled plasma source, are being investigated for the fabrication of stable and reliable nanocrystalline Si thin films.

However, conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to control the ion energy using radio frequency (RF) of CCP generated plasma. Any attempt to enhance the reaction kinetics by increasing the applied power results in increased bombardment of the deposited film, which creates a poor quality films with a high defect concentration. Additionally, the low plasma density associated with these types of sources ($\sim 1 \times 10^8$-$10^9$ cm$^{-3}$) leads to limited reaction possibilities in the plasma and on the film surface, inefficient generation of active radicals for enhanced process kinetics, inefficient oxidation, and reduction of impurities at low thermal budgets, which limits their usefulness in the fabrication of low-temperature electronic devices.

A deposition process that offers a more extended processing range and enhanced plasma characteristics than conventional plasma-based techniques, such as sputtering, PECVD, etc., is required to generate and control the particle size for PL/EL based device development. A process that can enhance plasma density and minimize plasma bombardment will ensure the growth of high quality films without plasma-induced microstructural damage. A process that can offer the possibility of controlling the interface and bulk quality of the films independently will enable the fabrication of high performance and high reliability electronic devices. A plasma process that can efficiently generate the active plasma species, radicals and ions, will enable noble thin film development with controlled process and property control.

For the fabrication of high quality SiOx thin films, the oxidation of the growing film is also critical to ensure high quality insulating layer across the nanocrystalline Si particles. A process that can generate active oxygen radicals at high concentrations will ensure effective passivation of the Si nanoparticles in the oxide matrix surrounding it. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and it is not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma parameters dictate the thin film properties and the desired film quality depends on the target application. Some of the key plasma and thin-film characteristics that depend on the target application are deposition rate, temperature, thermal budget, density, microstructure, interface quality, impurities, plasma-induced damage, state of the plasma generated active species (radicals/ ions), plasma potential, process and system scaling, and electrical quality and reliability. A correlation among these parameters is critical to evaluate the film quality as the process map will dictate the film quality for the target application. It may not be possible to learn or develop thin-films by just extending the processes developed in low density plasma or other high density plasma systems, as the plasma energy, composition (radical to ions), plasma potential, electron temperature, and thermal conditions correlate differently depending on the process map.

Low temperatures are generally desirable in liquid crystal display (LCD) manufacture, where large-scale devices are formed on transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

To date, electrically pumped light emitting devices, using Si nanocrystalline (nc) Si oxide (SiOx) films as active layers, require relatively large turn-on voltages. These turn-on voltages, often greater than 80V, prevent the practical application of these devices.

It would be advantageous if Si nanocrystalline SiOx film could be fabricated that operated with lower turn-on voltages.

SUMMARY OF THE INVENTION

The present invention demonstrates that by optimizing the thickness and Si richness of SiOx active layers, as deposited using a HDPECVD (high density plasma-enhanced chemical vapor deposition) process, light-emitting device turn-on voltages can be reduced dramatically due to the minimized surface and charge trap effects, which prevent high effective electrical fields in the active SiOx layers. Light emitting devices (LEDs) with low turn-on voltages below 20V have been measured. The electroluminescence (EL) outputs of this type of LEDs are strongly correlated to current injection levels. Conventionally, it has been thought that higher current injection is created by reducing the thickness of a Si active layer, thereby creating higher electrical fields. However, it is shown experimentally that simply reducing the thicknesses of the SiOx active layers results in surface and charge trap effects that lead to built-in counter-reacting fields. These counter-reacting fields decrease the "true" fields being applied on the LED and, thus, prevent effective limit current injection. As a result, conventionally fabricated SiOx light emitting devices are made with thicknesses exceeding 200 nm. The present invention describes optimized process windows for HDPECVD and post-deposition processes that achieve efficient current injections for LEDs with thinner SiOx active layers. With the optimized HDPCVD and post-deposition annealing processes, Si-nc SiOx films can be fabricated with thicknesses of less than 200 nm, and with turn-on voltages that have been reduced from ~80V to below 20V.

Accordingly, a method is provided for forming a light emitting device using a Si nanocrystalline SiOx film. The method provides a doped semiconductor or metal bottom electrode. Using a high density plasma-enhanced chemical vapor deposition (HDPECVD) process, a Si insulating film is deposited overlying the semiconductor electrode, having a thickness in a range of 30 to 200 nanometers (nm). The Si insulating film additionally includes O, N, or C elements. For example, the Si insulating film may be SiOx, where X is less than 2, $Si_3Nx$, where X is less than 4, or SiCx, where X is less than 1. Subsequent to depositing the Si insulating film, the Si film is annealed, and as a result, Si nanocrystals are formed. Then, a transparent metal electrode is formed overlying the Si nanocrystalline Si insulating film.

The annealed Si nanocrystalline SiOx film has a conductivity of less than $1\times10^6$ ohms/cm, with respect to an electric field of not less than 1 megavolt per centimeter (Mv/cm), and a Si volume filling factor in the range between 2.5% and 20%. Further, an LED with an annealed Si nanocrystalline SiOx film of less than 60 nm has a turn-on voltage of less than 20 volts, as defined with respect to a surface emission power of greater than 0.03 watt per square meter ($W/m^2$). The annealed Si nanocrystalline SiOx film has an emission wavelength centered around 800 nm with a spectral width of about 150 nm (Full Width at Half Magnitude). The annealed Si nanocrystalline SiOx film also has a space and charge trap field of about 0.6 megavolts per centimeter (MV/cm) for a film thickness of about 200 nm.

Additional details of the above-described method, a light emitting device using a Si nanocrystalline Si insulating film, and a method for generating light using a light emitting device are presented below.

DETAILED DESCRIPTION

Figure 1:
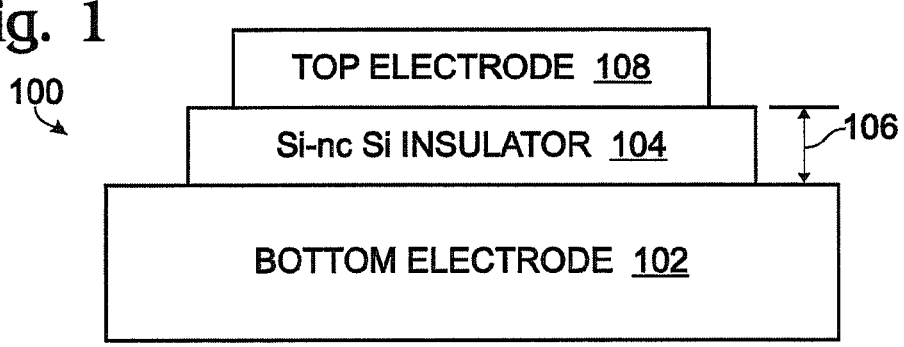
FIG. 1 is a partial cross-sectional view depicting a light emitting device using a silicon (Si) nanocrystalline Si insulator film.

FIG. 1 is a partial cross-sectional view depicting a light emitting device using a silicon (Si) nanocrystalline Si insulator film. The device 100 comprises a semiconductor electrode 102, doped with either an n or p dopant. Alternately, the bottom electrode may be a metal. A Si nanocrystalline Si insulator film 104 overlies the semiconductor electrode 102, having a thickness 106 in a range of 30 to 200 nanometers (nm). The Si insulating film 104 may be SiOx, where X is less than 2, $Si_3Nx$, where X is less than 4, or SiCx, where X is less than 1. As explained in more detail below, Si nanocrystalline Si insulating films have an unexpected optimal range of thicknesses, especially when considering that it was conventionally thought that high optical emission power was thought to be associated with films having a thickness of at least 200 nm. The unexpected thickness range is dependent upon the Si richness of the film 104.

A transparent metal electrode 108 overlies the Si insulating film 104. The transparent electrode can be indium tin oxide (ITO), for example, or a thin conductive metal such gold or platinum. A Si nanocrystalline SiOx film 104, for example, has a Si volume filling factor in a range between 2.5% and 20%, and a conductivity of less than $1 \times 10^6$ ohms/cm, with respect to an electric field of not less than 1 megavolt per centimeter (Mv/cm).

When powered (see FIG. 2), a Si nanocrystalline SiOx film 104 of less than 60 nm has a turn-on voltage of less than 20 volts with respect a surface emission power of greater than 0.03 watt per square meter ($W/m^2$). The Si nanocrystalline SiOx film 104 has an emission wavelength centered around 800 nanometers nm with a spectral width of about 150 nm (Full Width at Half Magnitude). As explained in more detail below, the Si nanocrystalline SiOx film 104 with a thickness of about 50 nm and a Si volume filling factor of about 18% has a space and charge trap field of about 0.7 Mv/cm, and a space and charge trap field of about 0.6 Mv/cm when the Si volume filling factor is below 10%.

The Si nanocrystalline SiOx film 104 has an optical index of about 1.93 for a Si volume filling factor of about 18%. The Si nanocrystals in the SiOx film typically have a diameter of about 4 nm, a density in a range of about $1.0 \times 10^{17}/cm^3$ to $5.4 \times 10^{18}/cm^3$, and a distance between Si nanocrystals in a range of about 5.7 to 10 nm.

Functional Description

High Density plasma chemical vapor deposition (HD-PCVD) processes have been developed to create Si insulator films with a higher density of silicon nanoparticles than can be achieved using conventional CVD or plasma-enhanced CVD (PECVD). Light emitting devices (LEDs) based on the resultant Si insulator films, which are sandwiched between electrode carrier injection layers, can be operated at lower turn-on voltages. The higher densities of silicon nanoparticles are achieved by certain gas combinations, gas ratios, RF power, and process temperatures, as verified by a higher silicon richness (with filling factors between 2% and 20%), which is measured using the optical index. The enhanced concentrations of silicon nanoparticles lead to efficient carrier injections through Fowler-Nordheim tunneling, with reduced average distances between silicon nanoparticles, which ultimately results in lower turn-on voltages. For even higher silicon nanoparticle concentrations (with filling factors >20%), SiOx LEDs show a higher conductivity, but emit less light. The SiOx processes and methodologies are also applicable to SiNx and SiCx films.

For SiOx LEDs with a relatively high Si richness (18% volume filling factors), the average number of Si nano-particles is $5.4 \times 10^{18}/cm^3$, assuming Si nano-particles are all spheres having an average diameter of 4.0 nm. Using this assumption, the average distance between the Si nanoparticle spheres are 5.7 nm. By comparing the diameters and average distances, it is observed that the packing of the Si nano-particles very tight, especially taking into the account size variations. This high density suggests that a higher Si richness leads to efficient quenching effects, since further increases of Si richness lead to electrically shortening the particles, which prevent the forming of (bound) excitons for light emitting.

Conventional PECVD processes can not generate enough ion plasmas to form this concentration of Si nanoparticles. Conventional ion implanting creates even higher Si concentrations, but the ion implanting process does not permit the formation of good (large grain) Si crystalline structures. That is because high energy Si ions damage Si insulating films. It should be noted that Si richness (volume filling factor) is not the same as Si nanoparticle density.

The electroluminescence (EL) output of LED shown in FIG. 1 is strongly correlated to current injection levels. For the same level of current injections, the EL intensities show only slight differences between devices under most deposition process conditions. Researchers have been unable to increase optical emission power by simple decreasing the thickness of conventional Si-nc SiOx films. Described herein is experiment data showing that a simple decrease in the thickness of conventional SiOx active layer results in stronger surface and charge trap effects that lead to larger built-in counter-reacting fields. These counter-acting fields decrease the actual fields applied to the light-emitting device and, thus, prevent effective current injection. In addition, simply decreasing SiOx thickness leads to less Si nanoparticles participating in emissions, preventing higher emission power. All these factors prevent the reduction of turn-on voltages in conventional LEDs by simply reducing the SiOx thickness. To address this issue, the process windows associated with HDPCVD and post-deposition processes have been optimized to achieve efficient current injections for light emitting devices having thinner SiOx active layers. With the optimized HDPCVD and post-deposition annealing processes, turn-on voltages had been reduced from ~80V to below 20V.

Figure 2A:
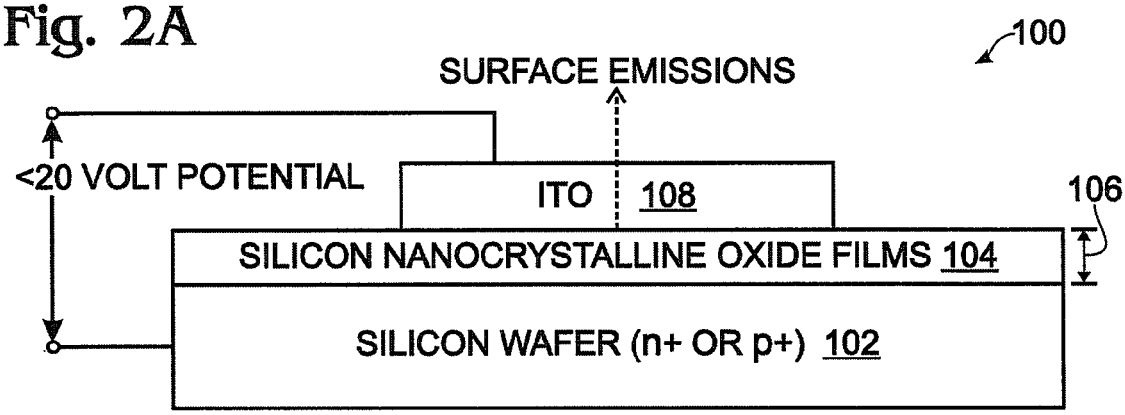
FIG. 2A is a partial cross-sectional view of a light-emitting device using Si nanocrystalline SiOx as an active layer.
Figure 2B:
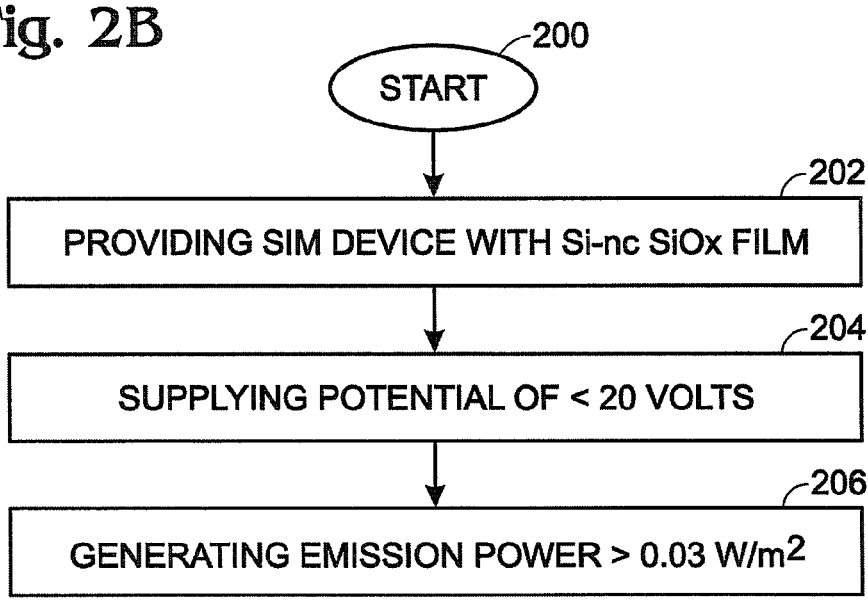
FIG. 2B is a flowchart illustrating a method for generating light using a SIM light emitting device.

FIG. 2A is a partial cross-sectional view of a light-emitting device using Si nanocrystalline SiOx as an active layer, and FIG. 2B is a flowchart illustrating a method for generating light using a SIM light emitting device. An electrically pumped light-emitting device is provided using a Si nanocrystalline SiOx film active layer 104 sandwiched between a doped silicon wafer 102 and transparent metal, such as ITO film 108. The active layer is deposited using HDPECVD processes to a thickness 106 in the range of 30 to 200 nm, and a transparent metal electrode overlying the SiOx film, Step 202. Assuming a film thickness of less than 60 nm and Si volume filling factor of about 18%, when a potential of less than 20 volts is applied across the device 100 (Step 204), a surface emission power of greater than 0.03 watt per square meter ($W/m^2$) is generated (Step 206). If the substrate (bottom electrode) is n doped, the substrate can be connected to ground and transparent electrode 108 connected to a positive voltage source. If the substrate is p doped, the transparent substrate 108 can be connected to ground and substrate 102 connected to a negative positive voltage source.

Figure 3:
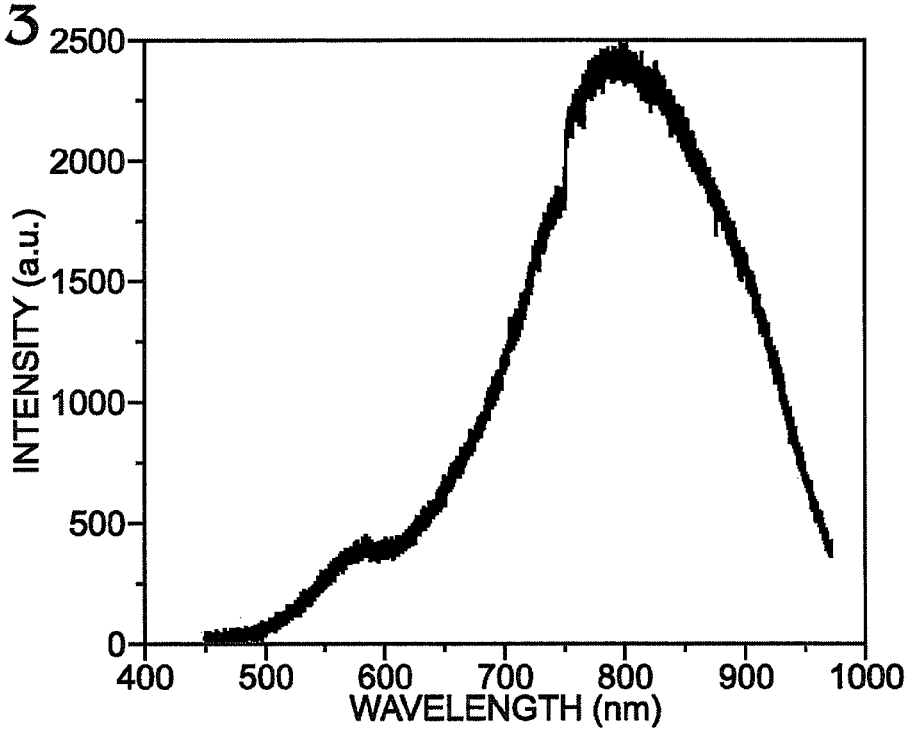
FIG. 3 is a graph depicting the results of a monochromator with a multiple-mode fiber, used as a probe was used to measure the spectra and light emitting spectrum of the device of FIG. 2A.

The surface emission wavelength is centered around 800 nm with a spectral width of about 150 nm (Full Width at Half Magnitude), see FIG. 3. With a film thickness 106 of about 200 nm, Si-nc SiOx film generates a space and charge trap field of about 0.6 Mv/cm. With a film thickness 106 of about 50 nm and a Si volume filling factor of about 18%, a Si-nc SiOx film generates a space and charge trap field of about 0.7 MV/cm, which is almost half the value measured in devices using conventional, un-optimized SiOx films.

FIG. 3 is a graph depicting the results of a monochromator with a multiple-mode fiber, used as a probe was used to measure the spectra and light emitting spectrum of the device of FIG. 2A. The figure indicates that the emission peak occurs at ~800 nm, very close to the photoluminescence (PL) peak wavelength.

Figure 4:
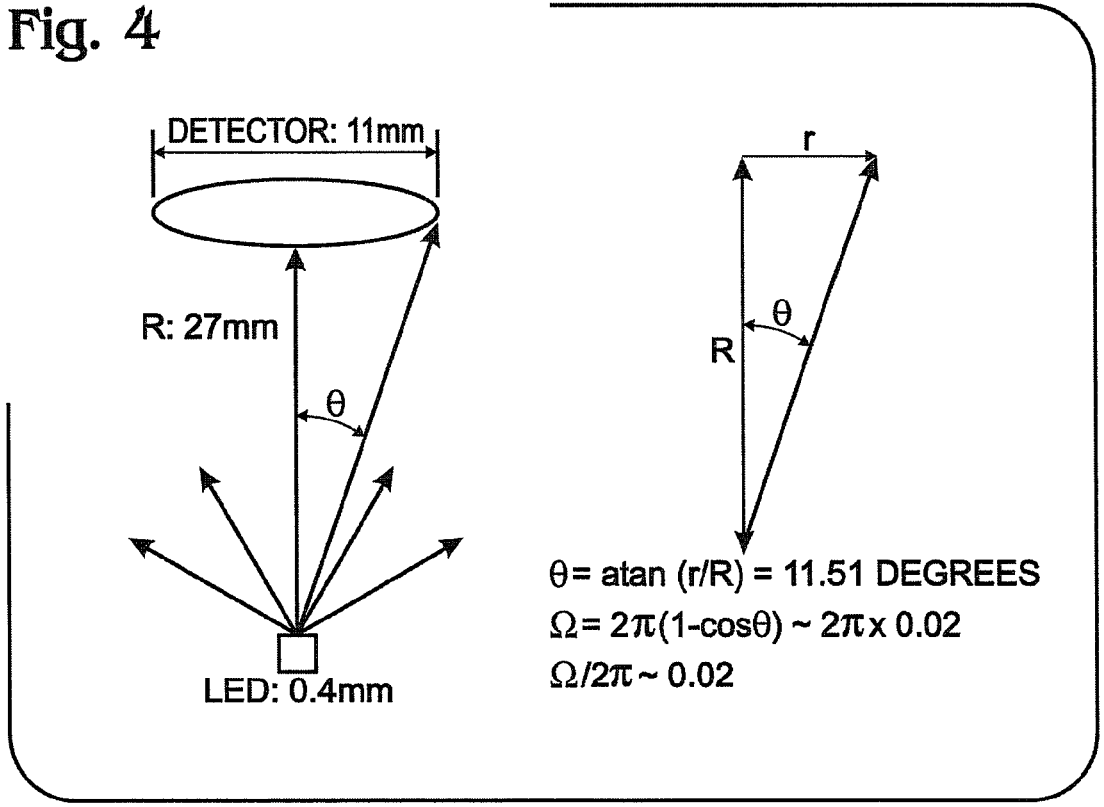
FIG. 4 is a schematic diagram depicting an EL light collecting setup.

FIG. 4 is a schematic diagram depicting an EL light collecting setup. The light emitting device can be regarded as point light source due to the small ratio of the cross-section with respect to the distance R.

Figure 5:
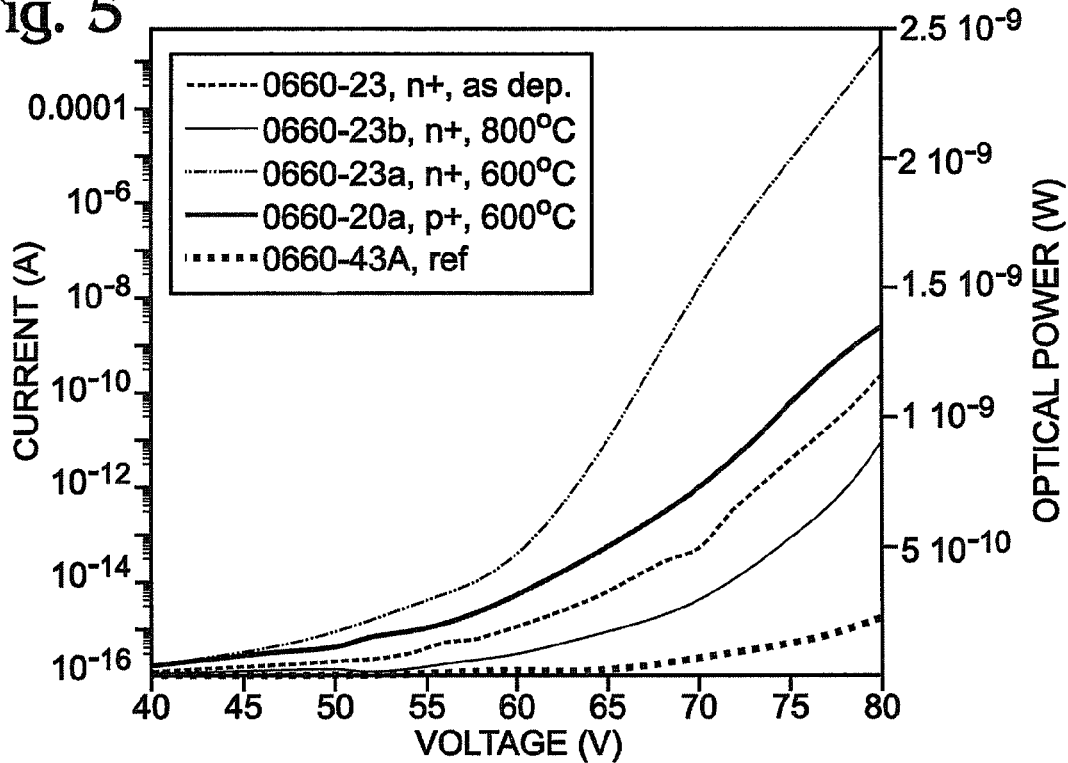
FIG. 5 is a graph depicting the dependence of light emitting properties on substrate wafer types and post-annealing processes.

FIG. 5 is a graph depicting the dependence of light emitting properties on substrate wafer types and post-annealing processes. The optical power is calculated using the setup shown in FIG. 4. As shown in FIGS. 1 and 2A, the light emitting device is a three-layer device. The light emitting output of the device is greatly influenced by the interface between these three layers. The type of dopant used in the bottom silicon wafers show significant influence. Light-emitting devices fabricated on n+ substrate wafers emit more light, as compared to p+ wafers, when forward biased. Further, the post-deposition annealing conditions (especially the temperatures) have a key influence on light emitting properties.

The results summarized in FIG. 5 clearly show that light emitting devices (LEDs) fabricated on n+ wafers are more efficient than LEDs from p+ type, when other process conditions and device structures are the same. Also, light emission is greatly enhanced by post annealing the LEDs at 600° C. for 15 minutes, as compared with LEDs annealed at 800° C. for 15 minutes.

Conventionally, it was known that the turn-on voltage for an electrical device active layer can be decreased by reducing the thickness of the active layer (while maintaining a constant current level). However, no such correlation exists between voltage, active layer thickness, and emission power of SiOx LEDs. Devices with thinner films normally also have less light emissions (since less material is involved in the emissions). Thus, to emit more light from a device active layer, an increase in voltage is required, which offsets any voltage drops that might be obtained by simply reducing the SiOx thickness.

For a Si-nc SiOx active layer, the minimum practical thickness was thought to be greater than 200 nm. Experimental studies confirm that conventional SiOx layers create a strong built-in counter-reacting field against the external field when made too thin, which prevents efficient current injection. A modified Fowler Nordheim theoretical model predicts the current injections for a Si-nc SiOx device can be described as:

$$J \propto E_{\mathit{eff}}^2 \exp(-E_{\mathit{Barrier}}/E_{\mathit{eff}})$$

where, $E_{\mathit{eff}} = E_{\mathit{ext}} - E_{\mathit{bui}}$;

$E_{\mathit{ext}}$ is the external field; and, $E_{\mathit{bui}}$ is the built-in counter-reacting field.

The counter-reacting field partially offsets the external fields by reducing the "true" field applied on the devices. It is usually a complicated function of $E_{\mathit{ext}}$. At the same time:

$$E_{\mathit{Barrier}} = 4(2m^*)^{1/2}(q\phi_B)^{3/2}(3qh);$$

where, $m^*$ is the effective mass of the carrier;

$q$ is the charge of the individual carrier;

$\phi_B$ is barrier height; and, $h$ is the Plank constant.

It is been seen that $E_{\mathit{Barrier}}$ accounts for the barrier potential height that the carriers must overcome in FN tunneling.

Figure 6:
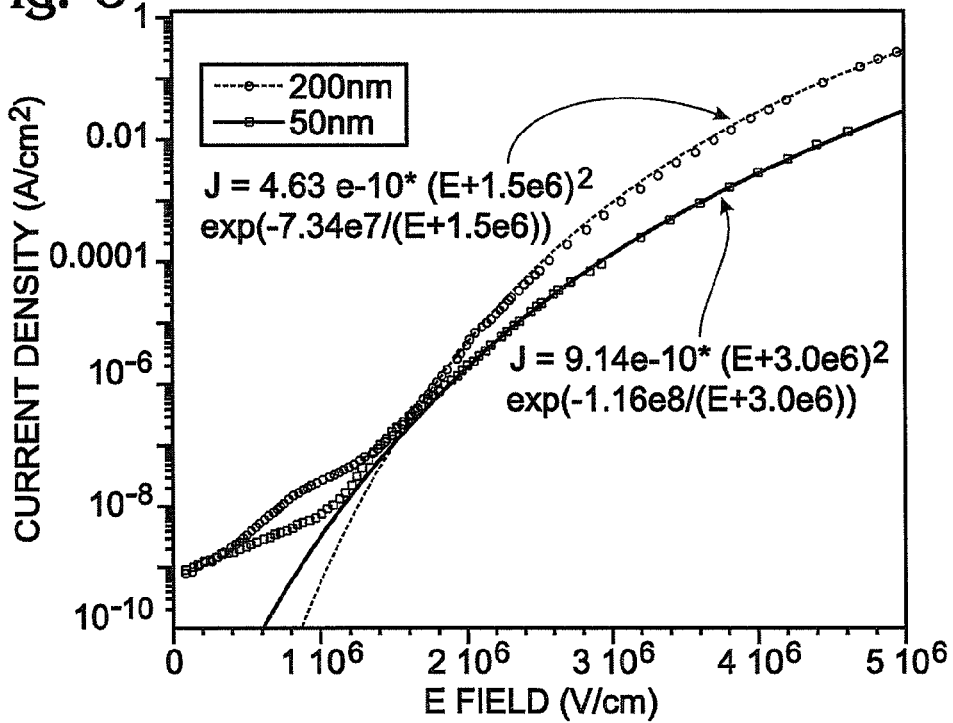
FIG. 6 is a graph comparing measured data with data calculated using the modified Fowler Nordheim models.

FIG. 6 is a graph comparing measured data with data calculated using the modified Fowler Nordheim models. Good agreement in data fitting is achieved. The results show that for the device with a 50 nm conventional SiOx layer, the $E_{\mathit{bui}}$ can be twice as high as those of 200 nm devices, preventing efficiency current injections and the achievement of low turn-on voltages. It should be noted that the fitting parameters for $E_{\mathit{Barrier}}$ are not the same for these two types of devices, even though they are fabricated using the same process and have the same device geometries except the thickness. This result can be explained by the differences of barrier potential tilting at different effective fields $E_{\mathit{eff}}$.

In summary, Si-nc SiOx LEDs with low turn-on voltages cannot be made conventionally unless thin active layers are used to improve current injection. However, when made thin (i.e., 200 nm or less), the counter-acting field $E_{\mathit{bui}}$ likewise prevents current injection. The present invention demonstrates a method to minimize the counter-reacting fields for thinner Si-nc SiOx devices, permitting the fabrication of low turn-on voltage LEDs. In addition to the optimized post-deposition conditions introduced above, optimized HDPECVD processes use the following steps:

(1) Keeping all the process parameters fixed while gradually reducing the flow rate of $N_2O$. At optimized conditions, this step can produce LEDs with turn-on voltages in the ranges below <40V for devices having a thickness of 200 nm; (2) Reducing the thickness of SiOx active layers while optimizing other HDPECVD parameters for a fixed flow ratio of $N_2O/SiH_4$, producing SiOx films with a relatively high Si richness. This step minimizes space charge effects that dramatically degrade efficient current injection for thinner films. Using optimized conditions, large turn-on voltage reductions can be achieved since the space and charge trap effects can be eased. The parameters used in the HDPECVD fabrication processes are summarized in Table 1 for two groups of LEDs, with ~50 nm and ~200 nm SiOx layers. Si-nc SiOx film is a type of Si-rich silicon oxide (SRSO) film. Low turn-on voltages below 20V (defined at 0.1 nW for measurement systems shown in FIG. 4, which corresponds to ~0.05 W/m²) are demonstrated, as shown in FIG. 7, where 17.5V is measured.

TABLE 1

| HDPECVD Fabrication Conditions for SRSO LEDs | | | | | | | | | |
|---|---|---|---|---|---|---|---|---|---|
| | Samples: | | | | | | | | |
| | 0725-11 | 0725-12 | 0725-01 | 0725-15 | 0725-16 | 0725-17 | 0660-08 | 0660-28a | 0660-27a |
| V @ 0.1 nW | 38.3 | 51.9 | 84.2 | 66.9 | 75.8 | 80.5 | 17.5 | 21.9 | 24.4 |
| SiH4 (sccm) | 25 | 25 | 25 | 25 | 25 | 25 | 25 | 25 | 25 |
| N2O (sccm) | 32 | 41 | 53 | 59 | 65 | 71 | 33 | 32 | 32 |
| RF (W) | 250 | 250 | 250 | 250 | 250 | 250 | 400 | 350 | 350 |
| Dep. Tem. (C.) | 150 | 150 | 150 | 150 | 150 | 150 | 300 | 150 | 150 |
| Thickness (A) | 2000 | 2000 | 2000 | 2000 | 2000 | 2000 | 566 | 522 | 522 |

Figure 7:
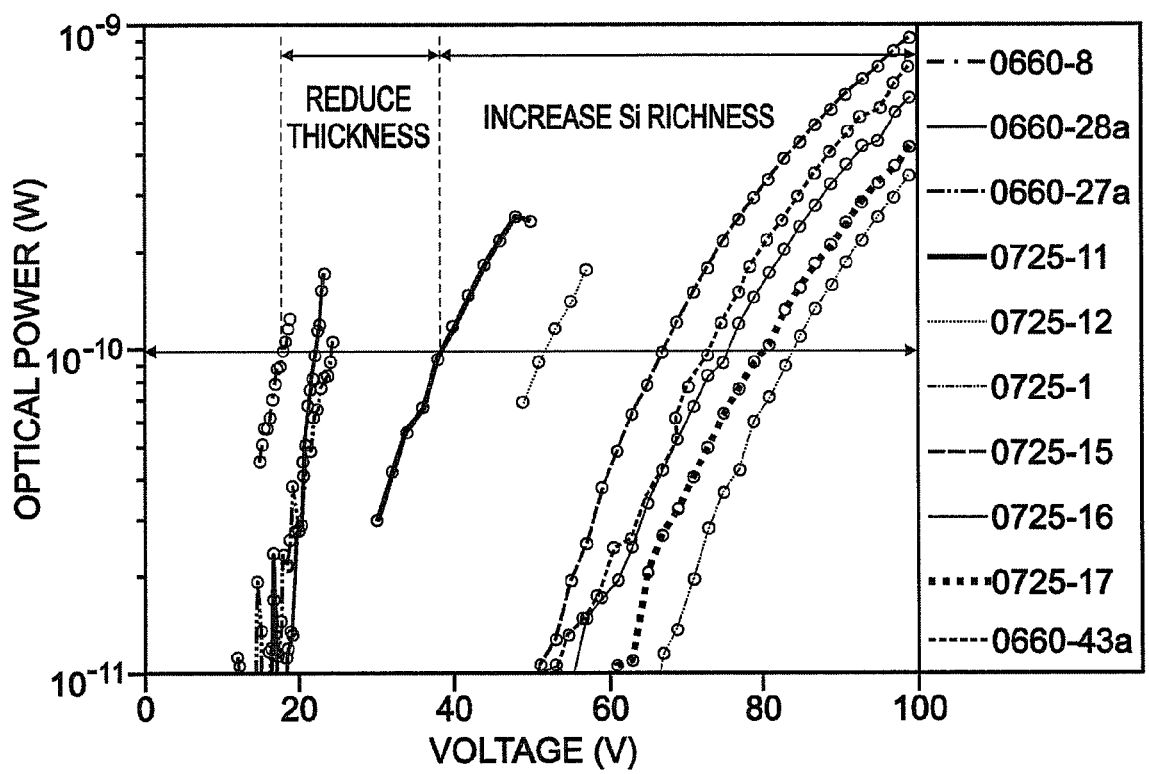
FIG. 7 is a graph depicting the turn-on voltages for the sample Si-nc SiOx films listed in Table 1.

FIG. 7 is a graph depicting the turn-on voltages for the sample Si-nc SiOx films listed in Table 1.

Table 2 lists parameters used in the HDPECVD fabrication processes, contrasting degrees of Si richness and various film thicknesses.

TABLE 2

HDPECVD Fabrication Conditions
To Enhance Si Richness of SiOx LEDs

| | Samples: | | | | | | | | | |
|---|---|---|---|---|---|---|---|---|---|---|
| | 0725-11 | 0725-12 | 0725-01 | 0725-15 | 0725-16 | 0725-17 | 0660-43a | 0660-08 | 0660-28a | 0660-27a |
| V @ 0.1 nW | 38.3 | 51.9 | 84.2 | 66.9 | 75.8 | 80.5 | 73.3 | 17.5 | 21.9 | 24.4 |
| SiH4 (sccm) | 25 | 25 | 25 | 25 | 25 | 25 | 25 | 25 | 25 | 25 |
| N2O (sccm) | 32 | 41 | 53 | 59 | 65 | 71 | 53 | 33 | 32 | 32 |
| RF (W) | 250 | 250 | 250 | 250 | 250 | 250 | 250 | 400 | 350 | 350 |
| Dep. Tem. (C.) | 150 | 150 | 150 | 150 | 150 | 150 | 150 | 300 | 150 | 150 |
| Thickness (A) | 2000 | 2000 | 2000 | 2000 | 2000 | 2000 | 2000 | 566 | 522 | 522 |
| | | | Si Richness | | | | | | Thickness | |

Table 3 cross-references HDPECVD fabrication conditions to an optical index (n).

TABLE 3

HDPECVD Fabrication Conditions
for SiOx LEDs of different Si Richness

Date: Aug. 30, 2007

| Samples | Wafer | ITO Ann. | Thick. (A) | SiH4 | N2O | Temp, C. | Power (W) | Optical Const.@365 nm | |
|---|---|---|---|---|---|---|---|---|---|
| | | | | | | | | n | k |
| 0660-23 | n + Si | No | 2000 | 25 | 32 | 150 | 350 | 1.84 | |
| 0660-8AB | n + Si | No | 566 | 25 | 33 | 300 | 400 | 1.93 | 0.053 |
| 0660-8CD | n + Si | Yes | 566 | 25 | 33 | 300 | 400 | 1.93 | 0.053 |
| 0725-32AB | n + Si | No | 948 | 25 | 32 | 150 | 250 | 1.88 | |
| 0725-32CD | n + Si | Yes | 948 | 25 | 32 | 150 | 250 | 1.88 | |
| 0725-33AB | n + Si | No | 745 | 25 | 71 | 150 | 250 | 1.64 | |
| 0725-33CD | n + Si | Yes | 745 | 25 | 71 | 150 | 250 | 1.64 | |
| 0725-34AB | n + Si | No | 1210 | 25 | 25 | 150 | 250 | 2.02 | |
| 0725-34CD | n + Si | Yes | 1210 | 25 | 25 | 150 | 250 | 2.02 | |
| 0725-35AB | n + Si | No | 800 | 25 | 25 | 150 | 250 | 2.02 | |
| 0725-35CD | n + Si | Yes | 800 | 25 | 25 | 150 | 250 | 2.02 | |

The Si richness inside SiOx films can be measured using the optical index of the thin films. Based on assumption that Si keeps the same dielectric constant $\in_{si}$ inside silicon oxide (with dielectric constant $\in_{ox}$), the effective dielectric constant $\in_{eff}$ can be calculated as the following:

$$\in_{eff} = f \times \in_{si} + (1-f) \times \in_{ox}$$

where f is the filling factor of silicon inside silicon oxide films. Since the real terms of $\in_{eff}$ are far larger than the imaginary terms (for loss), the measured optical index $n_{eff}$ of SiOx films can be expressed as:

$$n_{eff} = (f \times \in_{si} + (1-f) \in_{ox})^{1/2}$$

With $\in_{ox}=2.37$ and $\in_{si}=11.68$, the effective optical index can be varied within a range from 1.54 (f=0) to 3.44 (f=100%) by controlling the Si richness. The samples summarized in Table 3 have an optical index that varies from 1.64 to 2.02, corresponding to Si filling factors ranging from 2.8% to 17.2%.

From Table 3, it can be seen that as the filling factor of Si is approaches 18% (e.g., sample 0725-34AB, no clear light emission is observed although the current injections are the most efficient. When the filling factor for Si is as low as 2.8% (e.g., 0725-33AB) strong light emission is observed, however, a high turn-on voltage is required. Based on these results, the optimum Si filling factors window should be between about 2.8% and about 18%. However, a slightly wider range is thought to be practical.

As noted above, the concept of decreasing the SiOx active film thickness in electrical devices, in an attempt to reduce operational voltages, is not new. Ideally, when comparing with devices having 200 nm and 50 nm thicknesses, the device of 50 nm should have a quarter of operational voltage as to the device of 200 nm, i.e., $V_{200\ nm}/200\ nm=V_{50\ nm}/50$ nm. Thus, if the ideal operational voltage is 40V for 200 nm device, then it should be 10V for 50 nm device.

However, these results cannot be achieved using conventional films. The space and charge trap effects prevent the occurrence of ideal fields as the film thickness is reduced from 200 nm to 50 nm. The built-in anti-field from the space charges increases from 1.5 mV/cm to 3.0 mV/cm, for conventional devices. Due to the space charge, for conventional 200 nm devices, the real operational voltages change from 40V to 70V (1 mV/cm~20V for 200 nm devices), which is the result measured and described above. As the thickness decreases from 200 nm to 50 nm, the separation distance between the space charges is reduced, and the effect of space charge is further enhanced. Thus, the operational voltage for a conventional 50 nm SiOx is 40V, instead of the ideal 10V.

However, the present invention processes can be used to fabricate devices with low operational voltages for 50 nm thick SiOx films. As noted above, the operational voltages are less than 20V, which is less than half the 40V turn-on voltage required for conventional 50 nm devices. The present invention processes minimize the space and charge trap effects to allow better scaling of voltages with thicknesses.

Figure 8:
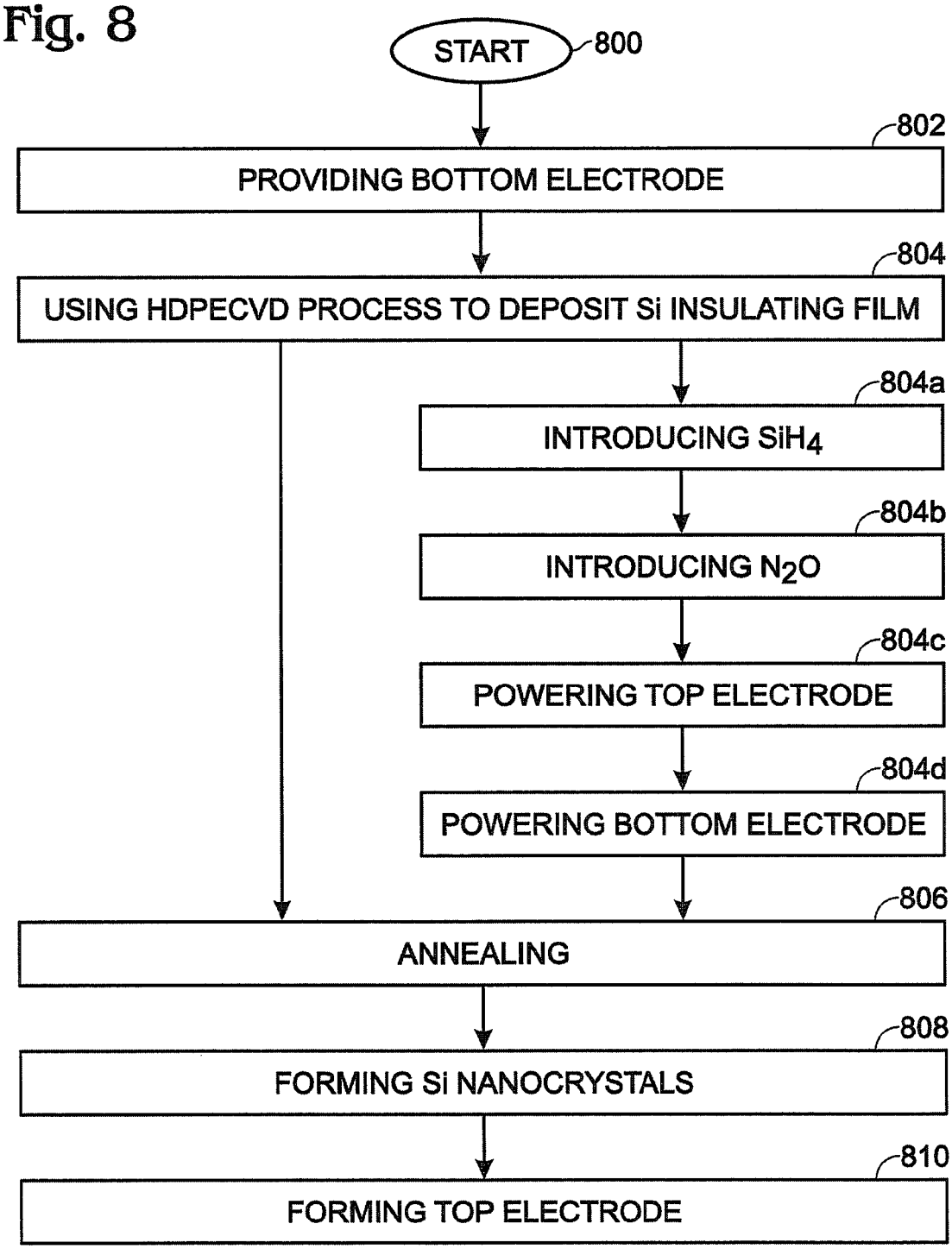
FIG. 8 is a flowchart illustrating a method for forming a light emitting device using a Si nanocrystalline Si insulating film.

FIG. 8 is a flowchart illustrating a method for forming a light emitting device using a Si nanocrystalline Si insulator film. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 provides either an n-doped or p-doped semiconductor, or a metal bottom electrode. Using a HDPECVD process, Step 804 deposits a Si insulator film overlying the semiconductor electrode, having a thickness in a range of 30 to 200 nm. The Si insulator film also includes O, N, or C. For example, the film may be SiOx, where X is less than 2, $Si_3Nx$, where X is less than 4, or SiCx, where X is less than 1. Step 806 anneals the S insulating film. In one aspect, the annealing duration is from about 10 to 120 minutes. If the bottom electrode is a semiconductor, the annealing temperature is in the range of about 550 to 600° C. If the bottom electrode is metal, the annealing temperature is in the range of 200 to 350° C. Step 808 forms Si nanocrystals in the Si insulating film in response to the annealing. Step 810 forms a transparent metal electrode overlying the SiOx film.

Depositing the Si insulating film in Step 804 includes substeps. Step 804a introduces silane ($SiH_4$) in the range of about 20 to 30 standard cubic centimeters (SCCM). Step 804b introduces $N_2O$ in the range of about 25 to 35 SCCM. Step 804c supplies power to a top electrode at a frequency in the range of 13.56 to 300 megahertz (MHz), and a power density in the range of about 1 to 20 watts per square centimeter ($W/cm^2$). Step 804d supplies power to a bottom electrode at a frequency in the range of 50 kilohertz to 13.56 MHz, and a power density in the range of about 1 to 5 $W/cm^2$.

An annealed Si nanocrystalline SiOx film has a conductivity of less than $1 \times 10^6$ ohms/cm, with respect to an electric field of 1 Mv/cm. In one aspect, the annealed Si nanocrystalline SiOx film has a Si volume filling factor in the range between 2.5% and 20%.

In another aspect, the annealed Si nanocrystalline SiOx film of less than 60 nm, with a Si volume filling factor of about 18%, has a turn-on voltage of less than 20 volts, as defined with respect to a surface emission power of greater than 0.03 watt per square meter ($W/m^2$), and an emission wavelength centered around 800 nm with a spectral width of about 150 nm (Full Width at Half Magnitude). In another aspect, the annealed Si nanocrystalline SiOx film has a space and charge trap field of about 0.6 Mv/cm for a film thickness of about 200 nm. For a film thickness of about 50 nm, with a Si volume filling factor of about 18%, the annealed Si nanocrystalline SiOx film has a space charge field of about 0.7 Mv/cm. With a Si volume filling factor below 10%, the 50 nm thick SiOx film has a space and charge trap field of about 1.2 Mv/cm.

In one aspect, the Si nanocrystalline SiOx film has an optical index of about 1.93 for a Si volume filling factor of about 18%. The Si nanocrystals in the SiOx film have a diameter of about 4 nm, a density in a range of about $1.0 \times 10^{17}/cm^3$ to $5.4 \times 0^{18}/cm^3$, and a distance between Si nanocrystals in a range of about 5.7 to 10 nm. The Si nanocrystals have a density and distance between nanocrystals dependent upon the Si volume fill factor.

Figure 9:
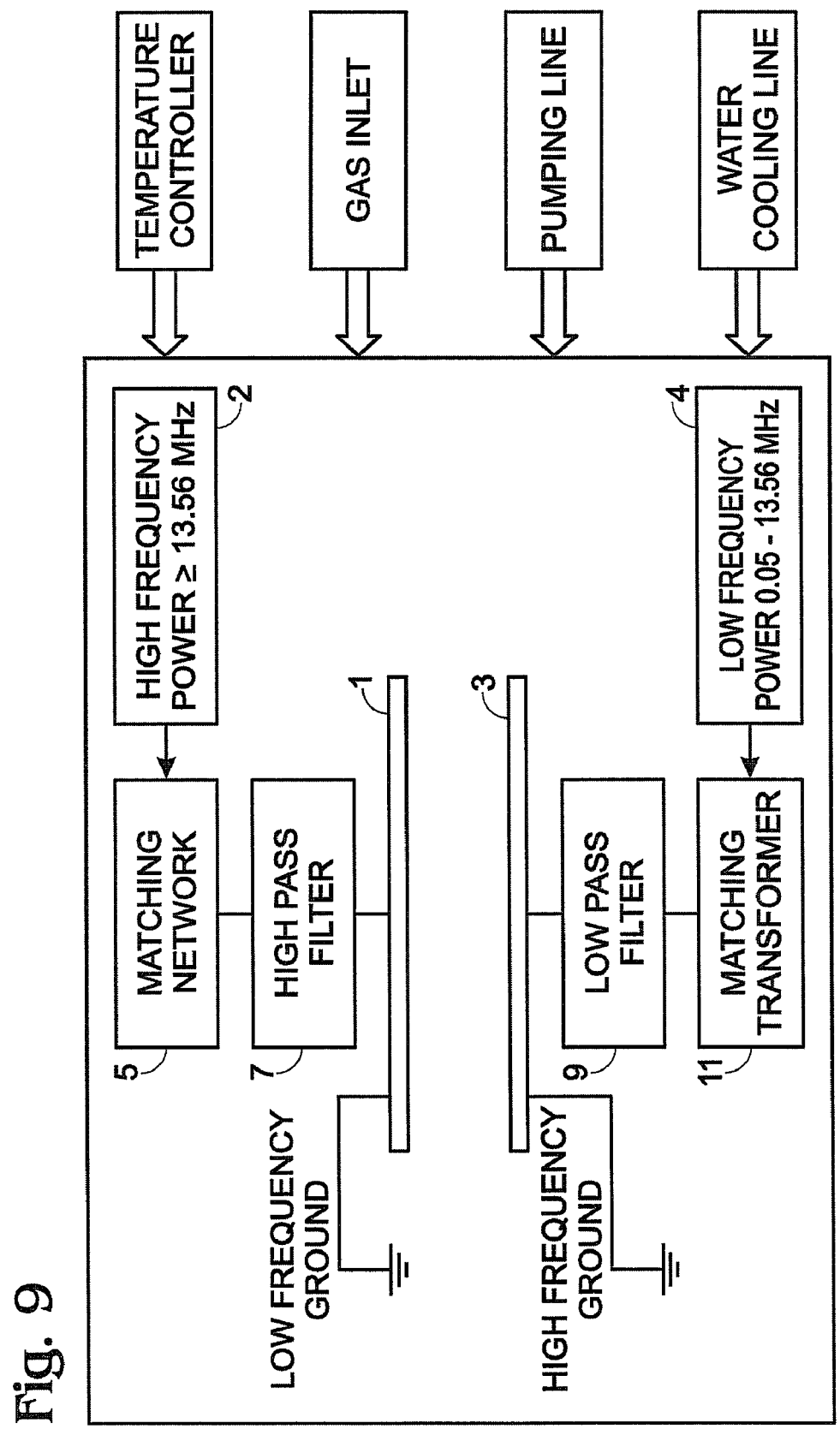
FIG. 9 is a schematic drawing of a high-density plasma (HDP) system with an inductively coupled plasma source.

FIG. 9 is a schematic drawing of a high-density plasma (HDP) system with an inductively coupled plasma source. The system depicted in Figure is one example of a system that can be used to enable the above-described HDPECVD process for the deposition of Si-nc SiOx. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter ($W/cm^2$), while the bottom electrode power can be as great as about 3 $W/cm^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high density plasma process with an electron concentration of greater than $1 \times 10^{11}$ $cm^{-3}$, and the electron temperature is less than 10 eV. There is no need to maintain a bias differential between the capacitor connected to the top electrode and the system body, as in many high density plasma systems and conventional designs such as capacitively-coupled plasma tools. Alternately stated, both the top and bottom electrodes receive RF and low frequency (LF) powers.

A light-emitting device made from a Si-nc Si insulator active layer has been presented along with an associated fabrication process. Explicit structures and process details have been given to illustrate the invention. However, the invention is not limited to merely these examples. Other variations and embodiments of the invention will occur to those skilled in the art.

We claim:
1. A method for forming a light emitting device using a silicon (Si) nanocrystalline Si insulating film, the method comprising:
   providing a bottom electrode selected from a group consisting of a doped semiconductor and metal;
   using a high density plasma-enhanced chemical vapor deposition (HDPECVD) process, depositing a Si insulator film overlying the bottom electrode, having a thickness in a range of 30 to 200 nanometers (nm) and consisting of SiOx, where X is less than 2;
   annealing the Si insulating film;
   forming Si nanocrystals in the Si insulating film in response to the annealing;
   forming a transparent metal electrode overlying the Si nanocrystalline Si insulating film;
   wherein depositing the SiOx film includes:
   introducing silane ($SiH_4$) in a range of about 20 to 30 standard cubic centimeters (SCCM);
   introducing $N_2O$ in a range of about 25 to 35 SCCM:
   supplying power to a top electrode at a frequency in a range of 13.56 to 300 megahertz (MHz), and a power density in a range of about 1 to 20 watts per square centimeter ($W/cm^2$); and,
   supplying power to a bottom electrode at a frequency in a range of 50 kilohertz to 13.56 MHz, and a power density in a range of about 1 to 5 $W/cm^2$.
2. The method of claim 1 wherein annealing the Si insulating film includes annealing the SiOx film:
   for a duration in a range of about 10 to 120 minutes;

at a temperature in a range of about 550 to 600° C. when the bottom electrode is a semiconductor; and, at a temperature in a range of about 200 to 350° C., when the bottom electrode is a metal.

3. The method of claim 1 wherein the Si nanocrystalline SiOx film has a conductivity of less than 1×10 ohms/cm, with respect to an electrical field of not less than 1 megavolt per centimeter (Mv/cm).

4. The method of claim 1 wherein the Si nanocrystalline SiOx film has a Si volume filling factor in a range between 2.5% and 20%.

5. The method of claim 1 wherein the Si nanocrystalline SiOx film has a turn-on voltage of less than 20 volts for a film having a thickness of less than 60 nm and a Si volume filling factor of about 18%, as defined with respect to a surface emission power of greater than 0.03 watt per square meter (W/m$^2$).

6. The method of claim 5 wherein the Si nanocrystalline SiOx film has an emission wavelength centered around 800 nm with a spectral width of about 150 nm (Full Width at Half Magnitude).

7. The method of claim 1 wherein the Si nanocrystalline SiOx film has a space and charge trap field of about 0.6 Mv/cm for a film thickness of about 200 nm.

8. The method of claim 1 wherein the Si nanocrystalline SiOx film has a space and charge trap field of about 0.7 Mv/cm for a film thickness of about 50 nm for a Si volume filling factor of about 18% and above 1.2 Mv/cm for a Si volume filling factor below 10%.

9. The method of claim 1 wherein the Si nanocrystalline SiOx film has an optical index of about 1.93 for a Si volume filling factor of about 18%.

10. The method of claim 1 wherein the Si nanocrystals in the SiOx film have a diameter of about 4 nm, a density in a range of about $1.0\times10^{17}/cm^3$ to $5.4\times10^{18}/cm^3$, and a distance between Si nanocrystals in a range of about 5.7 to 10 nm.

11. The method of claim 10 wherein the Si nanocrystals have a density and distance between nanocrystals dependent upon the Si volume kill factor.

* * * * *